United States Patent
Butler

(10) Patent No.: US 6,563,377 B2
(45) Date of Patent: May 13, 2003

(54) CLASS D SWITCHING AUDIO AMPLIFIER

(75) Inventor: Joel Butler, Gardner, KS (US)

(73) Assignee: Evenstar, Inc., Overland Park, KS (US)

( * ) Notice: Subject to any disclaimer, the term of this patent is extended or adjusted under 35 U.S.C. 154(b) by 0 days.

(21) Appl. No.: 09/973,360

(22) Filed: Oct. 9, 2001

(65) Prior Publication Data

US 2003/0067348 A1 Apr. 10, 2003

(51) Int. Cl.⁷ .............................. H03F 3/38; H03F 3/217
(52) U.S. Cl. ........................... 330/10; 330/59; 330/109; 330/207 A
(58) Field of Search .......................... 330/10, 59, 109, 330/207 A, 251

(56) References Cited

U.S. PATENT DOCUMENTS 4,206,415 A * 6/1980 Boudouris et al. ............. 330/59
5,973,368 A * 10/1999 Pearce et al. ............ 330/251 X
6,078,214 A * 6/2000 Zhang ................ 330/207 A X
6,211,728 B1 4/2001 Chen et al. .................... 330/10

OTHER PUBLICATIONS

Intersil Application Note; Author: George E. Danz; Title: Class–D Audio II Evaluation Board; Date: Mar. 1996.

* cited by examiner

Primary Examiner—Steven J. Mottola
(74) Attorney, Agent, or Firm—Hovey Williams LLP

(57) ABSTRACT

A Class D switching audio amplifier incorporating four state modulation, input-to-output drive and feedback signal isolation, dual topology output filtration, and a low inductance board layout. The four state modulation results in a common mode voltage in the absence of audio. The input-to-output isolation of drive and feedback signals allows for elimination of large power transformers in applications without user-accessible outputs. Such isolation may make use of optical isolators. The output filter includes common mode and differential topology filter stages. The low inductance board layout treats the amplifier and power supply boards as modules, and utilizes both sides of the amplifier board in order to minimize trace length.

10 Claims, 13 Drawing Sheets

CLASS D SWITCHING AUDIO AMPLIFIER

BACKGROUND OF THE INVENTION

1. Field of the Invention

The present invention relates to Class D switching audio amplifiers. More particularly, the present invention relates to a Class D switching audio amplifier making use of four state modulation, input-to-output drive and feedback signal isolation, a dual topology output filter, and a low inductance board layout.

2. Description of the Prior Art

It is often desirable to amplify audio signals using a Class D switching audio amplifier. Basic circuit layout of the Class D amplifier is substantially similar to that of linear amplifiers, such as Class A, B, and AB, with a major difference being in the signals provided to an output stage. Rather than feeding an audio waveform directly to the output stage, as is done in linear amplifiers, the Class D amplifier first feeds the audio waveform into a Pulse Width Modulator (PWM) circuit which feeds modulated pulses to the output stage. By quickly switching the output stage completely on and completely off with varying pulse widths, the Class D amplifier is able to recreate waveforms of almost any shape, and, by filtering the switching output, sound is produced by a loudspeaker connected thereto. In practice, the pulses are fed to the output stages at a frequency between 100 and 300 kHz, or 100 to 300 thousand pulses per second, which is required to produce a smooth waveform at the loudspeaker.

An advantage of the Class D amplifier is that the output stage transistors are switched either completely on or completely off. Amplifier topologies that operate in a partially on state, such as Class A and AB, act like resistors and produce heat, thereby wasting energy. Thus, Class D amplifiers are substantially more efficient than non-switching linear amplifiers. Higher efficiency and less waste heat allows the Class D amplifier to utilize a smaller power supply and to be offered in a more compact package than a comparable linear amplifier.

Unfortunately, existing Class D amplifier designs suffer several disadvantages, including disadvantages related to modulation, isolation, feedback, and board layout. Existing Class D amplifier designs incorporate a full H-bridge output stage and use a single PWM signal to derive four FET gate drive signals providing two H-bridge switch states. Both H-bridge switch states result in a differential voltage across the outputs leading to current flow through the load. These two-state Class D amplifiers typically compare a reference triangle waveform to an audio error waveform (audio feedback) using a single comparator. The output of the comparator is a single PWM signal with the same frequency as the reference triangle waveform. The PWM signal is then passed through a logic circuit that generates four drive signals used to drive the H-bridge, resulting in a 180° phase difference between $output_{NEG}$ and $output_{POS}$. Thus, a differential voltage is always present at the output causing power to be lost via the loudspeaker or low pass filter even in the absence of an audio input to the amplifier.

Existing Class D amplifiers typically require large power transformers to accommodate a relatively inefficient output stage and to meet government regulations requiring high voltage isolation between AC mains and all user-accessible inputs and outputs. This isolation is typically achieved by incorporating one or more power transformers between the AC mains and the input and output stages. Unfortunately, such power transformers are large and expensive. Furthermore, because 99% of any incoming power is required to drive the output stage and the loudspeakers connected thereto, a power transformer isolating the output stage must be substantially larger than a power transformer isolating the input stage.

Even in applications where the outputs are not user-accessible, no effort is typically made to isolate the input stage from the output stage. Where input-to-output isolation is attempted, small-signal audio transformers are typically used. Unfortunately, these transformers suffer from limited frequency response, making implementation difficult.

Typical output efficiencies for prior art linear amplifiers are approximately 60%, with the remaining 40% of supplied power being dissipated as heat. Consequently, expensive heat-sinking is required, and large, expensive power transformers are needed to deliver 66% more power than the desired output power of the amplifier. With the development of Class D amplifiers, output efficiencies increased to 85%, thereby reducing power supply requirements and waste heat. Unfortunately, expected theoretical efficiencies of 90+% for the Class D amplifier have not been achieved, due primarily to the many problems and disadvantages set forth herein.

Existing high-power Class-D amplifier designs incorporate a control or feedback loop to minimize distortion. Conventional control theory requires filtering, attenuating, and summing the output signal with the input signal. This typically involves a feedback loop comprising a differential RC low pass filter, followed by an attenuating differential amplifier, and then a summing amplifier to combine the feedback signal with the input signal. For high power applications where common-mode voltages can exceed 70 Vdc, precision matching of feedback resistors is a critical concern. Resistor tolerances greater than 1% in the differential amplifier and the RC low pass filter sections result in reduced common-mode rejection, potentially damaging voltages at the differential amplifier, and degraded product reliability. The RC low pass filter is required to attenuate the PWM switching energy and to pass the audio signal to the differential amplifier. This can result in decreased efficiency as power is lost in the RC low pass filter even in the absence of an audio input signal. High power applications require the use of high power resistors (>1 W) that can effectively dissipate the switching energy. Unfortunately, precision matching and increased power handling requirements for the RC low pass filter resistors result in increased cost and size. For example, surface mount 1 W 1% resistors are 7.5 times larger and 18 times more expensive than standard ¼ W 5% surface mount resistors.

Existing Class-D amplifier designs incorporate pairs of multi-pole differential LC low pass filters to filter the ever-present differential switching output voltage. Typical multi-pole differential LC filter designs dissipate a majority of attenuated energy in the first LC low pass filter pair. No advantage is gained from common-mode filtering because the output of the H-bridge continues to be a differential voltage. As a result, high power designs are required to incorporate expensive high power inductors that can dissipate the switching energy even when no audio input signal is present.

Existing Class D amplifiers typically exhibit high harmonic distortion above 1 kHz as a result of pulse transient damping issues and poor triangle waveform damping generation. Excessive pulse undershoot and overshoot result from high inductance board layouts and power supplies. Some existing designs attempt to reduce pulse overshoot and undershoot on H-bridge outputs by incorporating large, expensive RC snubbers. Such undershoot and overshoot can degrade reliability for many standard FET driver ICs such as Harris' HIP4080A. Additionally, pulse transient damping issues also lead to increased EMI emissions that increase the cost of shielding the amplifier.

Triangle waveform generation has always been a source of distortion in Class D amplifier designs. Triangle waves are typically generated using RC oscillators made of operational amplifiers or logic gates. These Class D amplifier designs suffer from high frequency noise superimposed on the triangle waveform; in turn, the high frequency noise results in increased harmonic distortion. Thus, existing Class D amplifiers typically exhibit undesirable harmonic distortion much greater than 0.5%.

Due to the above-identified and other problems and disadvantages in the art, a need exists for an improved Class-D audio switching amplifier.

SUMMARY OF THE INVENTION

The present invention overcomes the above-identified as well as other problems and disadvantages in the art of Class D and linear audio amplifiers by providing a Class D switching amplifier operable to provide increased efficiency, increased reliability, and reduced distortion through use of four state modulation, input-to-output driver and feedback signal isolation, dual topology output filtration, and a low inductance board layout. Though not limited thereto, the amplifier is particularly ideal for applications without user-accessible outputs, such as powered loudspeakers, wherein isolation of input-to-output drive and feedback signals allows for the elimination of large expensive power transformers required by the prior art. Furthermore, though not limited thereto, the amplifier is particularly ideal for high-power applications involving, for example, 50 W or more.

The preferred Class D switching amplifier broadly comprises an input stage; a triangle stage; a gate drive stage; an output stage; a filter stage; and a feedback stage. The input stage is operable to receive first and second feedback signals, FDBK_P and FDBK_N, and an audio input signal, AUDIO_IN, and to therefrom derive first and second error signals, ERROR and ERROR_INV. The error signals represent the combined audio input and error for both positive and negative swings.

The triangle stage is operable to derive a low noise triangle waveform, TRIANGLE, having reduced high frequency noise that might otherwise lead to excessive distortion.

The gate drive stage is operable to generate four optically isolated gate drive signals, DRV_Q1, DRV_Q2, DRV_Q3, and DRV_Q4. Within the gate drive stage, the ERROR signal and the TRIANGLE waveform are also compared to produce an output signal, PWM_A; and the ERROR_INV signal and the TRIANGLE waveform are compared to produce an output signal, PWM_B. The PWM_A and PWM_B signals are then input, respectively, to first and second optoisolators. The optoisolators preferably allow isolated pulse transmission with minimal delay and pulse width distortion. The outputs of the optoisolators are taken directly to produce, respectively, the DRV_Q2 and DRV_Q3 gate drive signals; and inverted to produce, respectively, the DRV_Q1 and DRV_Q4 gate signals.

The output stage is operable to receive the gate drive signals and to derive therefrom intermediate output signals, OUT_HP and OUT_HN, and broadly comprises first and second H-bridge halves which combine to form a full H-bridge.

The filter stage is operable to reduce EMI emissions by attenuating switching energy, and is essential for series connecting, or "daisy chaining", the floating output stages of multiple instances of the Class D switching audio amplifier. The filter stage receives as input the OUT_HP and OUT_HN signals, and broadly comprises a four-pole LC low pass filter combining common-mode filter topology for lowering inductor current in the absence of an audio input signal, and differential filter topology for attenuating high frequency differential signals. The filter stage provides final output signals, OUT_P and OUT_N, to drive the loudspeaker or other load.

The feedback stage is operable to provide the processed feedback signals, FDBK_P and FDBK_N, to the input stage, and broadly comprises first and second optoisolators 84,86 and first and second RC low pass filters 88,90. Within the feedback stage, the OUT_HP and OUT_HN signals produced by the output stage are optoisolated and filtered through RC low pass filters to result in the FDBK_P and FDBK_N signals.

As mentioned, the present invention introduces a unique four state modulation scheme that advantageously increases efficiency and allows for common-mode filtering to reduce loss during no-audio conditions. Using the four state modulation scheme of the present invention, in the absence of an audio input signal the H-bridge outputs are common-mode (in phase) and no current is delivered to the load. In the presence of an audio input signal, the H-bridge outputs differentially drive current through the load at double the frequency of the triangle waveform.

The input stage is isolated from the output stage using optoisolators. Alternatively, small signal transformers may be used in place of the optoisolators; however, the optoisolators, being more cost and space effective, are preferred. Many available optoisolators provide fast data transmission while minimizing pulse distortion effects. By isolating the input from the output, applications without user-accessible outputs can advantageously eliminate expensive high power transformers commonly found in existing amplifiers, thereby resulting in an estimated 75% weight savings and 40% cost savings over typical prior art amplifiers.

Furthermore, isolating the input stage from the output stage advantageously allows the output stage to float with respect to the chassis or input ground, which, in turn, allows for series connecting or "daisy chaining" multiple amplifiers to increase power delivered to the loudspeaker. Another benefit of floating the output stage is reduction of typical Class D chassis referenced DC voltage present at the amplifier output.

Additionally, the present invention improves upon prior art Class D feedback topology by isolating feedback signals and referencing the RC low pass filter to the input stage ground. This improvement eliminates potentially damaging differential and common-mode voltages present in the feedback circuit. As a result, precision resistor matching is no longer required, and less power is lost in the RC low pass filter. Thus, isolating the feedback signals substantially reduces costs and increases efficiency and design reliability.

The filter stage includes an LC low pass output filter operable to attenuate the high frequency switching, pass the amplified audio signal, reduce radiated emissions, and smooth the output current. In prior art Class D amplifiers, differential LC low pass filter designs are used with 3 dB cutoffs at no less than 25 kHz. Regardless of whether audio is present at the output or not, the filter is absorbing energy at the switching frequency. With prior art modulation schemes no advantage was gained from common-mode filtering because the output of the H-bridge was a differential voltage waveform. As a result, high power designs were required to incorporate expensive high current, low resistance inductors in the LC low pass filters that could absorb the switching energy with or without an audio signal present.

The modulation scheme of the present invention results in a common-mode voltage in the absence of audio that allows for use of a combination common-mode and differential LC low pass filter constructed with inexpensive 5022 series surface-mounted inductors. The first two-pole LC low pass filter combination is arranged in a common-mode topology; the second two-pole LC low pass filter combination is arranged in a differential topology. Through use of a four pole combined common mode and differential LC output filter, inductor current is reduced in the absence of an audio signal. With the first two-pole combination typically absorbing more power, a common-mode topology results in less power dissipation by reducing inductor current 37% over prior art filters. By incorporating a differential second two-pole combination, the filter maintains beneficial rejection of high frequency differential signal components.

The present invention utilizes a unique low inductance board layout and modularization that advantageously lowers pulse overshoot and undershoot, leading to reduced distortion, reduced radiated emissions, and increased efficiency. The low inductance design allows for elimination of expensive RC snubbers common in prior art Class D amplifiers. With the improved board layout, harmonic distortion has been reduced to less than 0.2% typical at 200 $W_{rms}$. Furthermore, the unique board layout reduces overall size and allows for small lightweight construction.

These and other important features of the present invention are more fully described in the section titled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
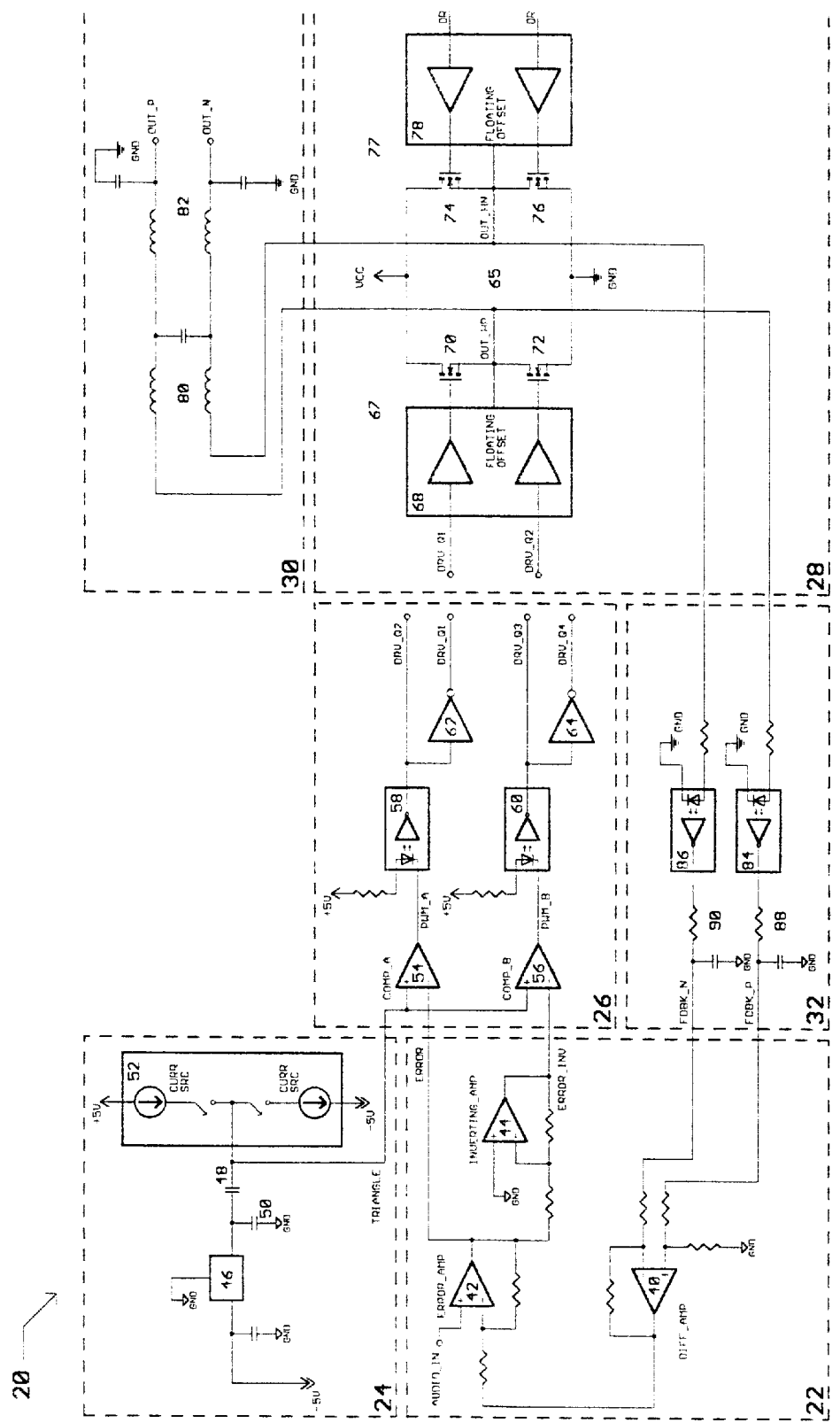
FIG. 1 is a circuit diagram of a preferred embodiment of the present invention.

Referring to FIG. 1, a Class D switching audio amplifier 20 is shown constructed in accordance with a preferred first embodiment of the present invention. The amplifier 20 is operable to provide increased efficiency, increased reliability, and reduced distortion through use of four state modulation, input-to-output drive and feedback signal isolation, dual topology output filtration, and a low inductance board layout. Though not limited thereto, the amplifier 20 is particularly ideal for applications without user-accessible outputs, such as powered loudspeakers, wherein isolation of input-to-output drive and feedback signals allows for the elimination of large expensive power transformers required by the prior art. Furthermore, though not limited thereto, the amplifier is particularly ideal for high-power applications involving, for example, 50 W or more. The preferred Class D switching amplifier 20 broadly comprises an input stage 22; a triangle stage 24; a gate drive stage 26; an output stage 28; a filter stage 30; and a feedback stage 32.

The input stage 22 is operable to derive first and second error signals, ERROR and ERROR_INV, and broadly comprises a differential amplifier 40; an error amplifier 42; and an inverting amplifier 44. The differential amplifier 40 receives from the feedback stage 32 first and second feedback signals, FDBK_P and FDBK_N, and combines said feedback signals into one single-ended signal. The single-ended signal is input to the error amplifier 42 where it is negatively summed with an audio input signal, AUDIO_IN. Thus is the ERROR signal derived, representing the combined audio input and error for both positive and negative swings. The ERROR_INV signal is derived by inverting the ERROR signal using the inverting amplifier 44.

Figure 2:
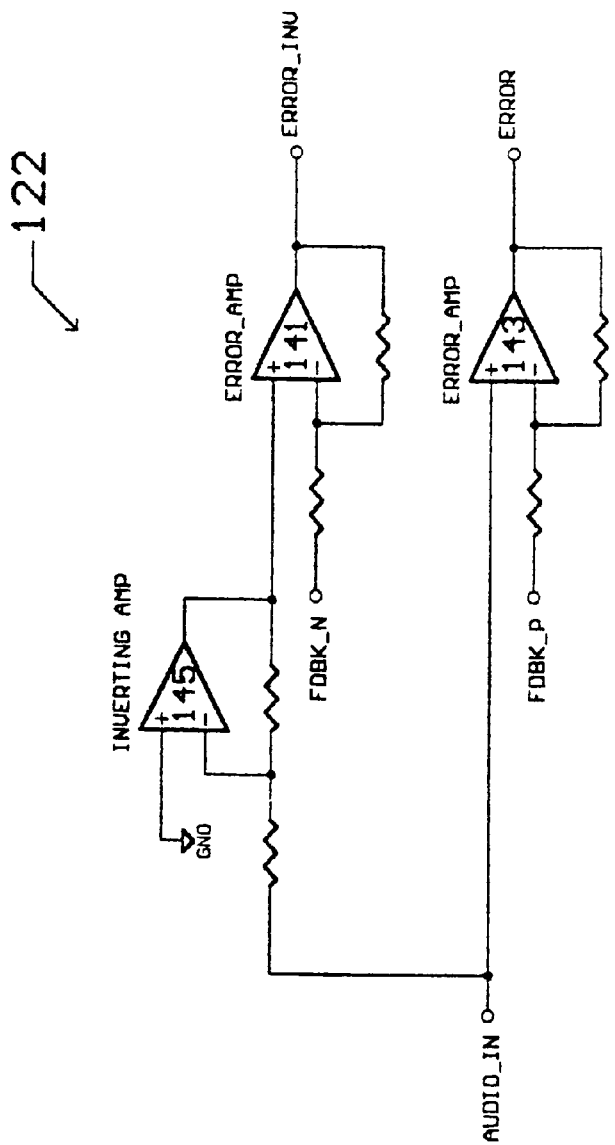
FIG. 2 is a circuit diagram of an alternate circuit topology for an input stage portion of the present invention.

It will be appreciated by those with ordinary skill in the electrical arts that alternative circuit topologies may be devised substantially equivalent in function to those described herein and shown in the figures. Referring also to FIG. 2, for example, an alternative topology for the input stage 122 is shown wherein two error amplifiers 141,143 and an inverting amplifier 145 are used in a substantially similar manner to generate the ERROR and ERROR_INV signals.

The triangle stage 24 is operable to derive a low noise triangle waveform, TRIANGLE, and broadly comprises an ultra-low noise voltage regulator 46; a ramp capacitor 48; and a low ESR capacitor 50; and a switched current source IC 52. The ultra-low noise voltage regulator 46 reduces high frequency noise that might otherwise lead to excessive distortion, and provides the ramp capacitor 48 with a clean supply rail with minimized high frequency transients. The low ESR capacitor 50 provides a low impedance path to ground for high frequency transients. The switched current source IC 52 provides a switched current capacitive charging circuit; a suitable switched current source IC 52 is available from Unitrode in the model UC3637. By incorporating such a switched current source IC, a majority of the components required for modulation signal derivation are self-contained, which results in reduced cost and minimizes board real estate usage. The TRIANGLE waveform is taken from the positive terminal of the ramp capacitor 48.

The gate drive stage 26 is operable to generate four optically isolated gate drive signals, DRV_Q1, DRV_Q2, DRV_Q3, and DRV_Q4, and broadly comprises a first comparator 54; a second comparator 56; a first optoisolator 58; a second optoisolator 60; a first invertor 62; and a second invertor 64. The ERROR signal and the TRIANGLE waveform are input to the first comparator 54 to produce an output signal, PWM_A; the ERROR_INV signal and the TRIANGLE waveform are input to the second comparator 56 to produce an output signal, PWM_B. The PWM_A and PWM_B signals are then input, respectively, to the first and second optoisolators 58,60.

The optoisolators 58,60 preferably allow isolated pulse transmission with minimal delay and pulse width distortion. A suitable optoisolator is available from NEC Corporation as model number PS9701, which allows for fast data transmission with a standard LED input drive and CMOS/TTL logic output. The outputs of the optoisolators 58,60 are taken directly to produce, respectively, the DRV_Q2 and DRV_Q3 gate drive signals; and inverted by the invertors 62,64 to produce, respectively, the DRV_Q1 and DRV_Q4 gate signals.

Figure 3:
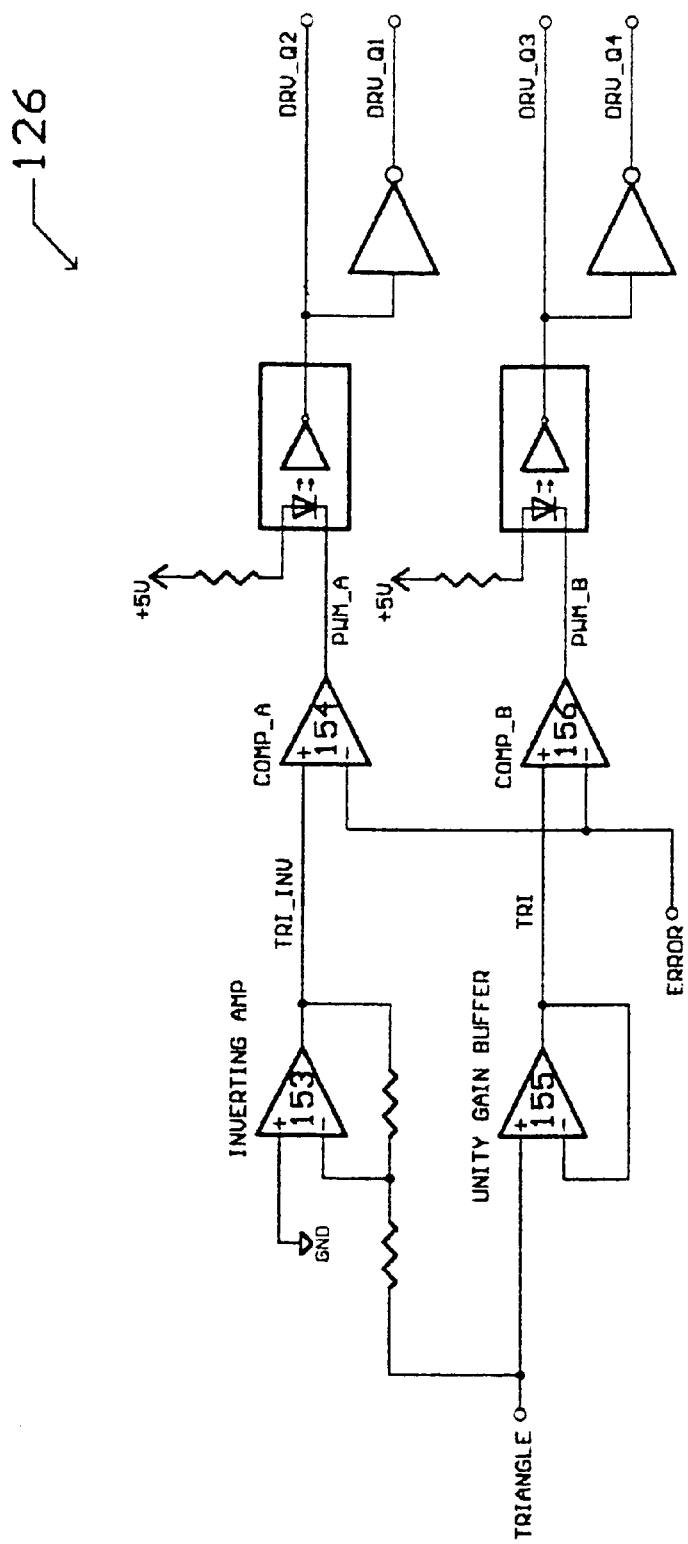
FIG. 3 is a circuit diagram of an alternate circuit topology for a gate drive stage portion of the present invention.

Referring also to FIG. 3, an alternative topology for the gate drive stage 126 is shown wherein a high-speed inverting amplifier 153 and a unity gain amplifier 155 precede, respectively, the first and second comparators 154,156. In this topology, rather than compare the TRIANGLE signal to the ERROR and ERROR_INV signals, the ERROR signal is compared to the TRIANGLE and a TRIANGLE_INV signal. The high-speed inverting amplifier 153 receives the TRIANGLE signal and produces the TRIANGLE_INV signal. The unity gain amplifier 155 buffers the TRIANGLE signal.

It will be appreciated that the gate drive stage 26, regardless of which circuit topology is used, includes a first internal branch and a second internal branch. In the illustrated embodiment, for example, the first internal branch includes the first comparator 54, the first optoisolator 58 and the first inverter 62, while the second internal branch includes the second comparator 56, the second optoisolator 60, and the second inverter 64. Also regardless of which topology is used, separate reference or triangle signals, whether TRIANGLE or TRIANGLE_INV, and separate error signals, whether ERROR or ERROR_INV, must be applied to each of the branches. Thus, as a matter of convenience, one may refer to a first triangle or error signal (applied to the first internal branch) and a second triangle or error signal (applied to the second internal branch) to encompass both situations where the first and second signals are identical and situations where the first and second signals are different in some way (e.g., one is inverted relative to the other). Use of the terms "first signal" and "second signal" should not be interpreted to preclude these signals from being identical signals branching from a single source signal.

The output stage 28 is operable to provide intermediate output signals, OUT_HP and OUT_HN, and broadly comprises a first half-bridge 67, including a first half-bridge FET driver IC (HVIC_1) 68 and first and second MOSFETs 70,72, and a second half-bridge 77, including a second half-bridge FET driver IC (HVIC_2) 78 and third and fourth MOSFETs 74,76. The HVIC_1 68 is operable to level shift the DRV_Q2 and DRV_Q1 signals prior to inputting said drive signals to the first and second MOSFETs 70,72, with said MOSFETs 70,72 combining to produce an output signal, OUT_HP. The HVIC_2 78 is operable to level shift the DRV_Q3 and DRV_Q4 signals prior to inputting said drive signals to the third and fourth MOSFETs 76,78, with said MOSFETs 76,78 combining to produce an output signal, OUT_HN. The HVIC_1 and HVIC_2 68,78 are required to properly drive the gates of each MOSFET 70,72,74,76 at potentially high voltages.

The filter stage 30 is operable to reduce EMI emissions by attenuating switching energy, and is essential for series connecting, or "daisy chaining", the floating output stages 28 of multiple instances of the Class D switching audio amplifier 20. The filter stage 30 receives as input the OUT_HP and OUT_HN signals, and broadly comprises a four-pole LC low pass filter combining common-mode filter topology 80 for lowering inductor current in the absence of an audio input signal, and differential filter topology 82 for attenuating high frequency differential signals. The filter stage 30 provides final output signals, OUT_P and OUT_N, to drive the loudspeaker or other load.

The feedback stage 32 is operable to provide processed feedback signals, FDBK_P and FDBK_N, to the input stage 22, and broadly comprises first and second optoisolators 84,86 and first and second differential RC low pass filters 88,90. The OUT_HP and OUT_HN PWM output signals produced by the output stage 28 directly drive LEDs of, respectively, the first and second optoisolators 84,86. Passing the PWM output signals through optoisolators 84,86 effectively attenuates the output signals. The differential RC low pass filters 88,90 are referenced to the input stage ground, and operate to further attenuate switching energy and pass the desired audio feedback signals. Driving the RC low pass filters 88,90 with the low voltage outputs of the optoisolators 86,88 lowers current in said RC low pass filters 88,90 and eliminates high common mode voltages at the differential amplifier 40. The result is increased efficiency, low resistor power handling requirements and reduced precision matching requirements. Isolating the feedback signals prior to the differential amplifier 40 and RC low pass filters 88,90 is necessary for complete input-to-output isolation and improves product reliability and lowers cost.

Figure 4:
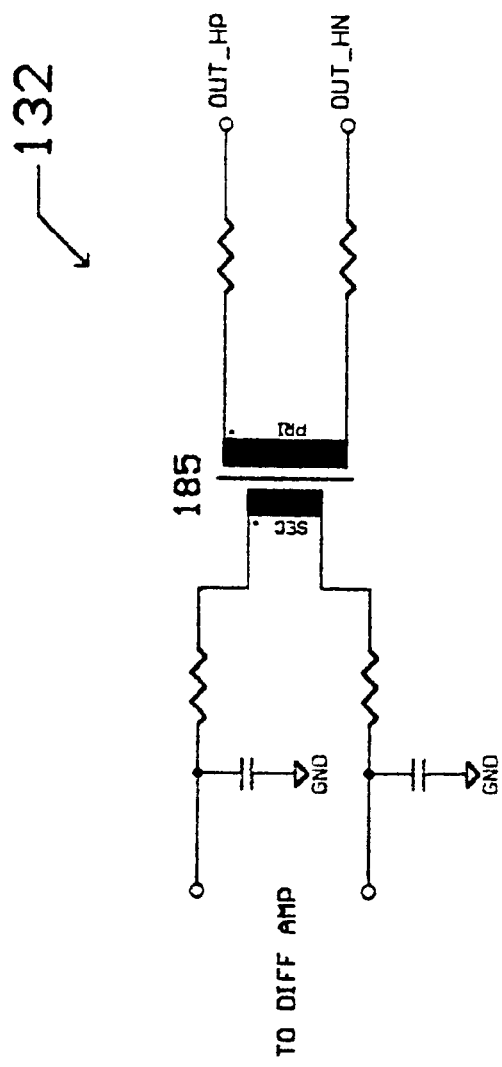
FIG. 4 is a circuit diagram of a first alternate circuit topology for a feedback stage portion of the present invention.

Referring also to FIG. 4, a first alternative topology for the feedback stage 132 is shown wherein isolation is accomplished using a high-frequency small signal transformer 185 rather than optoisolators. A disadvantage of this topology is pulse distortion and poor performance as the pulse width approaches 100% duty cycle. Nevertheless, this first alternative topology may be desirable for some applications.

Figure 5:
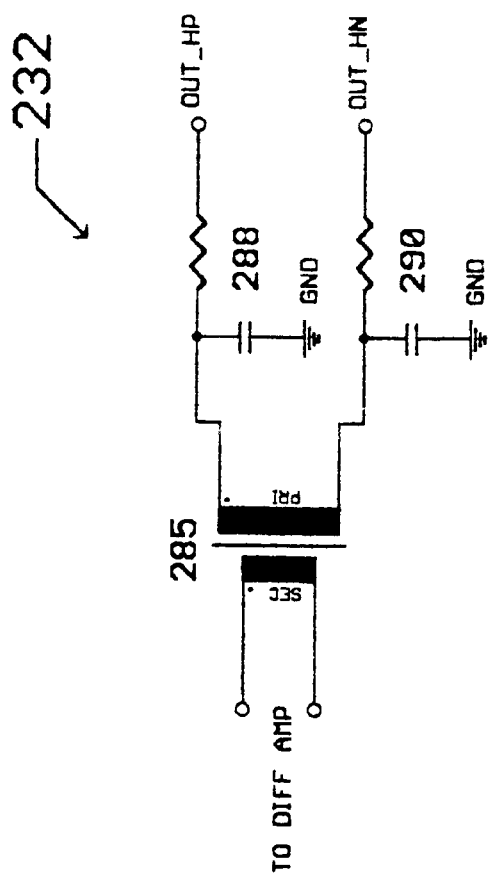
FIG. 5 is a circuit diagram of a second alternate circuit topology for the feedback stage portion of the present invention.

Referring also to FIG. 5, a second alternative topology for the feedback stage 232 is shown wherein isolation is accomplished using an audio small signal transformer 285 following the first and second RC low pass filters 288,290. A disadvantage of this topology is that it cannot servo out DC error, and that significant power is lost in said RC low pass filters 288,290. Nevertheless, this second alternative topology may be desirable for some applications.

As mentioned, the Class D switching audio amplifier 10 is operable to provide increased efficiency, increased reliability, and reduced distortion through use of four state modulation, input-to-output optical isolation, feedback isolation, dual topology output filtration, and a low inductance board layout.

Referring also to FIGS. 6, 7, 8, and 9, the four state modulation scheme increases efficiency and allows for common-mode filtering to reduce loss during no-audio conditions.

Existing Class-D amplifier designs typically use one comparator to compare a reference triangle waveform to an error signal. The output of the comparator is a single PWM signal with the same frequency but different duty cycle as the reference triangle waveform. The PWM signal is used to drive the four MOSFET output switches in a full H-bridge configuration, wherein the four drive signals are derived from the single PWM signal by inversion.

The four state modulation scheme of the present invention, when used to drive the full H-bridge output stage 28, increases efficiency by reducing loss when no AUDIO_IN signal is present at the input stage 22, and, furthermore, allows for a more efficient filter stage 30 design. The modulating signals, DRV_Q1, DRV_Q2, DRV_Q3, and DRV_Q4, used to drive the output MOSFETs 70,72,74,76 are derived in the gate drive stage 26 by comparing the ERROR signal to the TRIANGLE waveform to produce the PWM_A signal; and comparing the ERROR_INV signal to the TRIANGLE waveform to produce the PWM_B signal. By comparing both the non-inverted and inverted error signals, the audio is effectively sampled at two points. This results in an output switching frequency two times higher than that of the TRIANGLE and zero current drive when no AUDIO signal is present.

Figure 6:
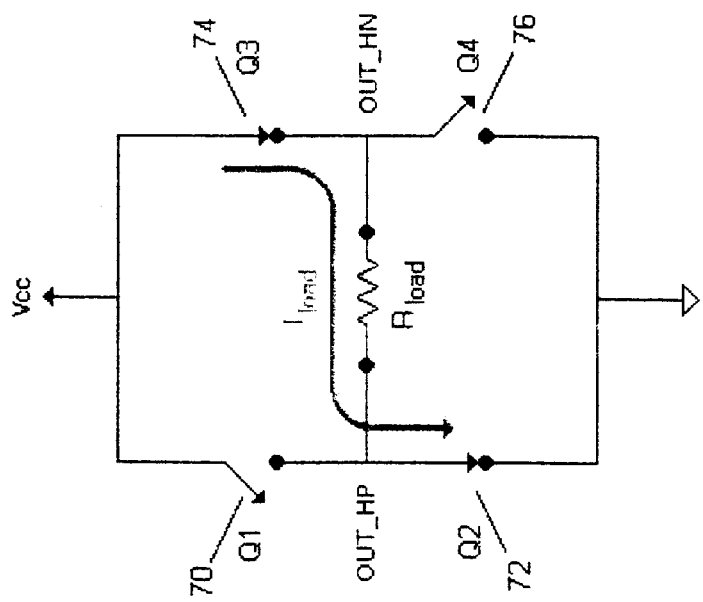
FIG. 6 is a depiction of a switching portion of the output stage in a configuration corresponding to a first switch state.
Figure 7:
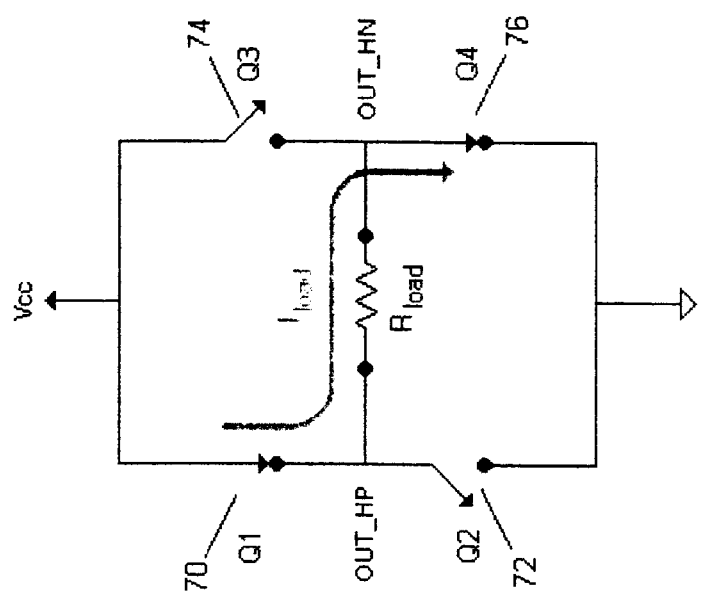
FIG. 7 is a depiction of the switching portion of the output stage in a configuration corresponding to a second switch state.
Figure 8:
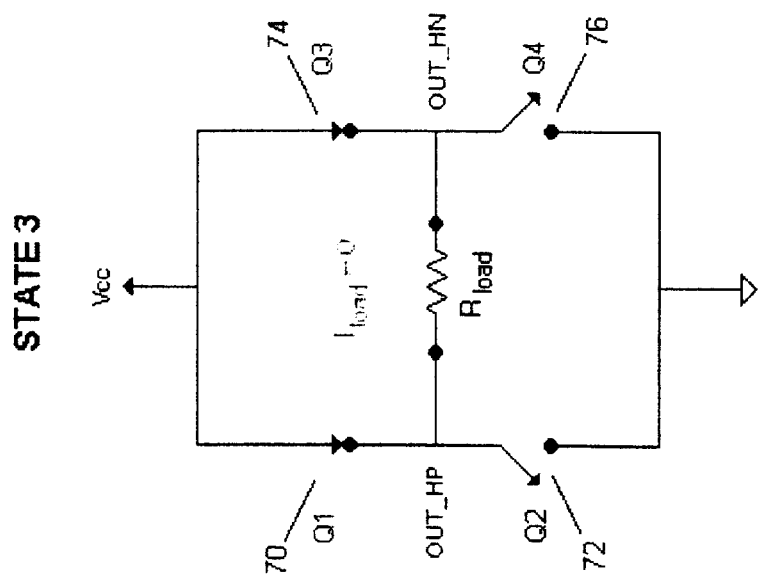
FIG. 8 is a depiction of the switching portion of the output stage in a configuration corresponding to a third switch state.
Figure 9:
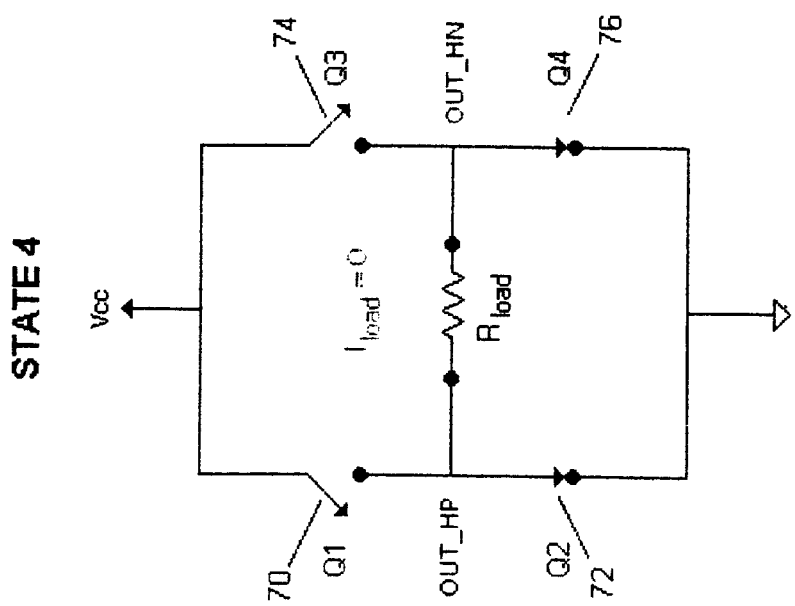
FIG. 9 is a depiction of the switching portion of the output stage in a configuration corresponding to a fourth switch state.

The DRV_Q2 and DRV_Q3 drive signals are taken directly from the PWM_A and PWM_B signals, while the DRV_Q1 and DRV_Q4 drive signals are derived by inversion. In the presence of an AUDIO_IN signal, the output signals, OUT_HP and OUT_HN, differentially drive current through the loudspeaker at double the frequency of the TRIANGLE waveform, as shown in FIGS. 6 and 7. In the absence of an AUDIO_IN signal, however, the OUT_HP and OUT_HN signals are common mode (in phase) and no current is delivered to the loudspeaker, as shown in FIGS. 8 and 9.

In the gate drive stage 26, the optoisolators 58,60 are incorporated to isolate the input from the output. Alternatively, small signal transformers may be used in place of the optoisolators; however, the optoisolators, being more cost and space effective, are preferred. The optoisolation of the present invention provides a minimum 2500V isolation barrier. Many available optoisolators provide fast data transmission and isolated pulse transmission while minimizing data throughput delays and pulse width distortion effects. By isolating the input from the output, applications without user-accessible outputs can advantageously eliminate expensive high power transformers commonly found in existing amplifiers, thereby resulting in an estimated 75% weight savings and 40% cost savings over a typical prior art amplifier.

Furthermore, isolating the input stage from the output stage advantageously allows the output stage to float with respect to the chassis or input ground, which, in turn, allows for series connecting or "daisy chaining" multiple amplifiers to increase power delivered to the loudspeaker. Another benefit of floating the output stage is reduction of typical Class D chassis referenced DC voltage present at the amplifier output.

Additionally, the present invention improves upon prior art Class D feedback topology by isolating feedback signals and referencing the RC low pass filter to the input stage ground. This improvement eliminates potentially damaging differential and common-mode voltages present in the feedback circuit. As a result, precision resistor matching is no longer required, and less power is lost in the RC low pass filter. Thus, isolating the feedback signals substantially reduces costs and increases efficiency and design reliability.

The filter stage 30 includes an LC low pass output filter operable to attenuate the high frequency switching and pass the amplified audio signal, and are required to reduce radiated emissions and smooth the output current. In prior art Class D amplifiers, differential LC low pass filter designs are used with 3 dB cutoffs at no less than 25 kHz. Regardless of whether audio is present at the output or not, the filter is absorbing energy at the switching frequency. With prior art modulation schemes no advantage was gained from common-mode filtering because the output of the H-bridge was a differential voltage waveform. As a result, high power designs were required to incorporate expensive high current, low resistance inductors in the LC low pass filters that could absorb the switching energy with or without an audio signal present.

The modulation scheme of the present invention results in a common-mode voltage in the absence of audio that allows for use of a combination common-mode and differential LC low pass filter constructed with inexpensive 5022 series surface-mounted inductors. The LC low pass filter reduces EMI emissions by attenuating switching energy, and is essential for series connecting, or "daisy chaining", the floating output stages 28 of multiple Class D switching amplifiers 20. The first two-pole LC low pass filter combination is arranged in a common-mode topology; the second two-pole LC low pass filter combination is arranged in a differential topology. Through use of a four pole combined common mode and differential LC output filter, inductor current is reduced in the absence of an audio signal. With the first two-pole combination typically absorbing more power, a common-mode topology results in less power dissipation by reducing inductor current 37% over prior art filters. By incorporating a differential second two-pole combination, the filter maintains beneficial rejection of high frequency differential signal components.

The low inductance board layout and modularization scheme advantageously lowers pulse overshoot and undershoot, leading to reduced distortion, reduced radiated emissions, and increased efficiency. The low inductance design also allows for elimination of expensive RC snubbers commonly found in prior art Class D amplifiers, and for simpler EMI shielding. With the improved board layout, harmonic distortion has been reduced to 0.2% typical at 200 $W_{rms}$. Furthermore, the unique board layout reduces overall size and allows for small lightweight construction.

Figure 10:
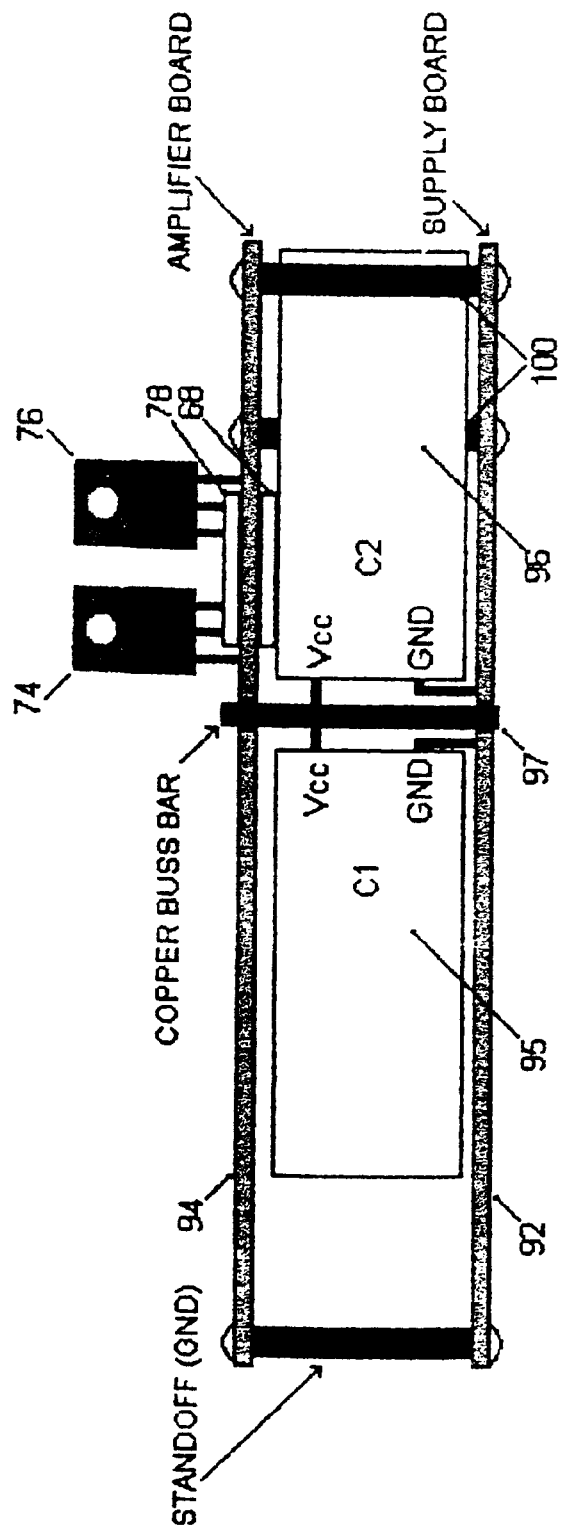
FIG. 10 is an side elevation view of a preferred hardware layout scheme of the present invention.
Figure 11:
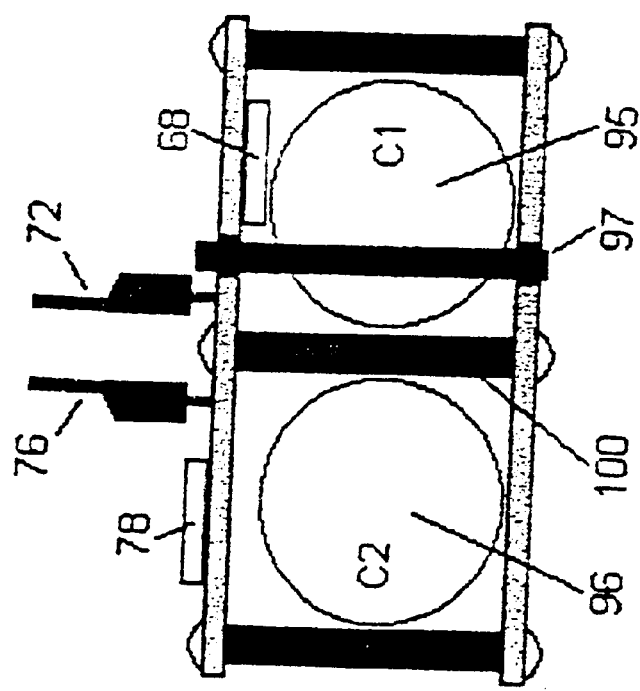
FIG. 11 is a front elevation view of the preferred hardware layout scheme shown in FIG. 10.

Referring also to FIGS. 10 and 11, the board layout calls for a power supply board 92 and an amplifier board 94 interconnected as a module or "power brick" to minimize inductance. The power supply board 92 includes two high value filter capacitors 95,96 and provides AC voltage rectification. The amplifier board 94 includes the amplifier circuit 10, described above, with the layout of said amplifier circuit 10 being such that the H-bridge of the output stage 28 resides directly above the high value filter capacitors 95,96. Interconnecting the power supply and amplifier boards 92,94 is a 12 gauge copper buss bar 97 which minimizes lumped inductance between the power supply circuit board 92 and the output stage 28. Standoffs 100 separating the power supply board 92 and amplifier boards 94 also provide low inductance paths to ground. The full H-bridge 65 of the output stage 28 is arranged with each half bridge 67,77 in parallel, and opposing MOSFET pairs 70,72 and 74,76 spaced 0.25 inches apart as shown in.

Figure 12:
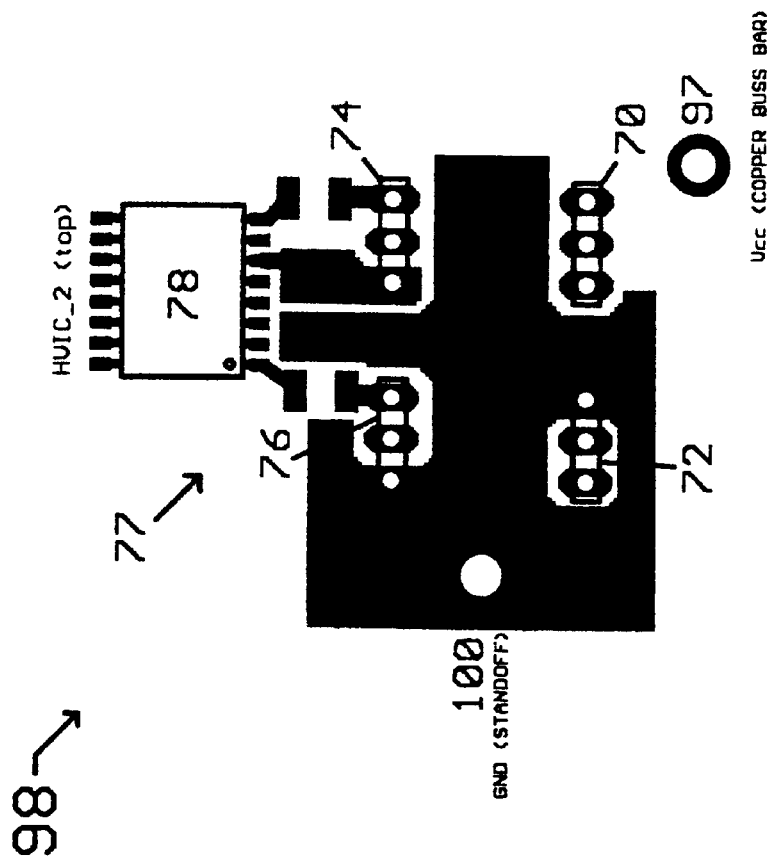
FIG. 12 is a top plan view of a topside amplifier board hardware mounting scheme.
Figure 13:
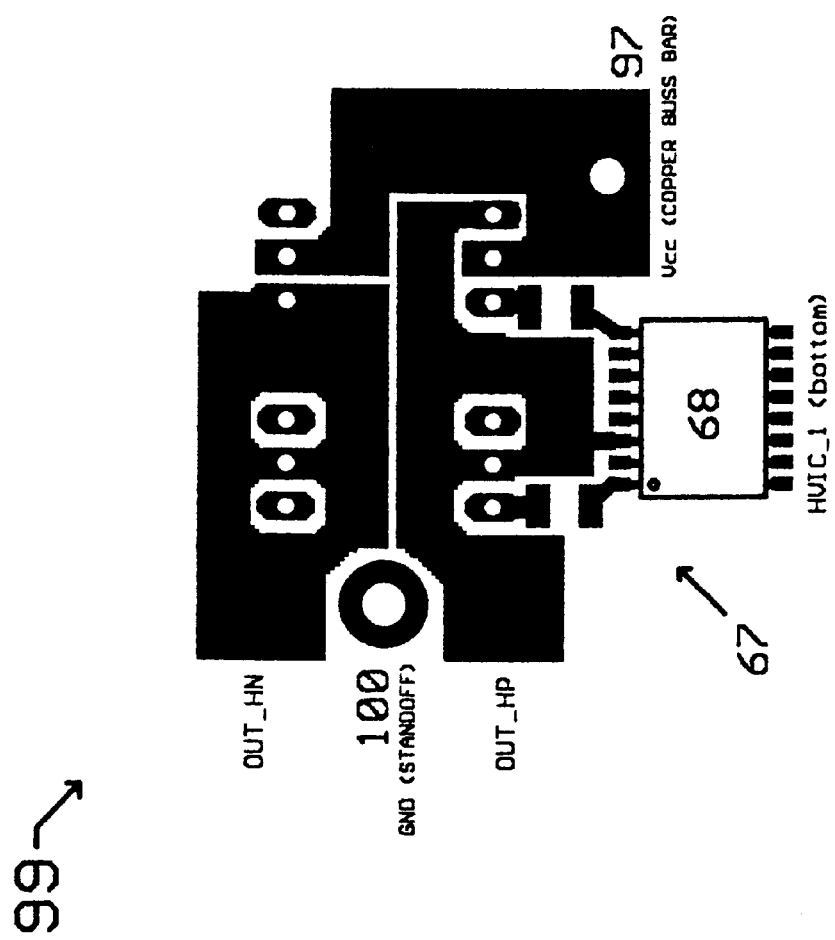
FIG. 13 is a top plan view of a bottomside amplifier board hardware mounting scheme.

FIGS. 12 and 13 illustrate low inductance board routing of a topside layer 98 and a bottomside layer 99 of the amplifier board 94. This arrangement minimizes lumped inductances between the H-bridge 65 and the filter stage 30. Spacing the half bridges 67,77 0.25 inches apart also allows for use of standard 0.25 inch aluminum bar stock heat sinking for minimized cost and weight.

Because HVIC_1 68 and HVIC_2 78 are off-the-shelf components, their pinouts are identical, meaning that if one is positioned for shortest lead length, the other must be positioned to have an undesirably long lead length. Those with ordinary skill in the art will appreciate that longer lead lengths result in undesirable disadvantages, including increased ringing and higher inductance. Thus, the present invention makes use of both the topside 98 and the bottomside 99 of the amplifier board 94 to shorten lead lengths.

By using both the topside 98 and bottomside 99 of the amplifier board 94, the positioning of each HVIC 68,78 immediately adjacent a respective half-bridge 67,77 minimizes inductances. By selecting an HVIC that has an optimal pinout, routing distances from the MOSFET gates 70,72,74,76 and sources can be minimized. One such HVIC is available from International Rectifier as the IR2113S half bridge driver. Thus, for example, by facing opposing MOSFETs 70,72,74,76 and placing HVIC_2 78 on the topside 98 of the amplifier board 94, and HVIC_1 68 on the bottomside 99 of the amplifier board 94, the pinouts of the HVICs 68,78 are made to appear identical, thus minimizing routing distances between the MOSFET gates 70,72,74,76. This HVIC placement advantageously reduces pulse overshoot and undershoot on the floating high side supply and gate drive pins of the HVICs reduces inductance between output nodes and the HVICs 68,78 high side floating supplies, increases reliability, and allows for higher power.

Thus, from the preceding description, it can be seen that the Class D switching audio amplifier of the present invention, in its various described embodiments, provides a Class D switching amplifier operable to provide increased efficiency, increased reliability, and reduced distortion through use of four state modulation, input-to-output optical isolation, feedback isolation, dual topology output filtration, and a low inductance board layout.

Although the invention has been described with reference to the preferred embodiments illustrated in the attached drawings, it is noted that equivalents may be employed and substitutions made herein without departing from the scope of the invention as recited in the claims. For example, as mentioned, circuit topologies alternative to those shown are easily devised but which do not depart from the inventive concepts disclosed herein and which, therefore, are considered within the scope of the present invention. Thus, by way of illustration, is the alternative input stage circuit topology shown in FIG. 2. Therefore, the concepts of the present invention should not be viewed as narrowly limited to the implementing circuit topologies described herein for purposes of illustrative disclosure.

Having thus described the preferred embodiment of the invention, what is claimed as new and desired to be protected by Letters Patent includes the following:

1. A method of providing an isolated feedback signal within a Class-D switching amplifier, wherein the Class D switching amplifier includes an H-bridge output stage having a first pulse width modulated output signal and a second pulse width modulated output signal, the method comprising the steps of:
   (a) driving a first isolator with the first pulse width modulated output to produce a first isolator output signal;
   (b) driving a second isolator with the second pulse width modulated output to produce a second isolator output signal;
   (c) low pass filtering the first isolator output to produce a first isolated feedback signal;
   (d) low pass filtering the second isolator output to produce a second isolated feedback signal; and
   (e) combining the first isolated feedback signal with and the second isolated feedback signal to produce a single-ended isolated feedback signal.

2. The method as set forth in claim 1, wherein the isolator is an optoisolator.

3. The method as set forth in claim 1, wherein the isolator is a small signal transformer.

4. A method of providing an isolated feedback signal within a Class-D switching amplifier, wherein the Class D switching amplifier includes an H-bridge output stage having a first pulse width modulated output signal and a second pulse width modulated output signal, the method comprising the steps of:
   (a) low pass filtering the first pulse width modulated signal to produce a first feedback signal;
   (b) low pass filtering the second pulse width modulated signal to produce a second feedback signal;
   (c) differentially driving a small signal transformer with the first feedback signal and the second feedback signal to produce a first isolated feedback signal and a second isolated feedback signal; and
   (d) combining the first isolated feedback signal with and the second isolated feedback signal to produce a single-ended isolated feedback signal.

5. A method of providing isolated feedback within an amplifier, the method comprising the steps of:
   (a) driving a first isolator with a first pulse width modulated signal to produce a first isolated feedback signal;
   (b) filtering the first isolated feedback signal;
   (c) driving a second isolator with a second pulse width modulated signal to produce a second isolated feedback signal;
   (d) filtering the second isolated feedback signal; and
   (e) combining the first isolated feedback signal and the second isolated feedback signal to result in a single-ended feedback signal.

6. A method of providing isolated feedback within an amplifier, the method comprising the steps of:
   (a) driving a first isolator with a first pulse width modulated signal to produce a first isolated feedback signal;
   (b) filtering the first isolated feedback signal;
   (c) driving a second isolator with a second pulse width modulated signal to produce a second isolated feedback signal; and
   (d) filtering the second isolated feedback signal, wherein the first isolator and the second isolator are both optoisolators.

7. A method of providing isolated feedback within an amplifier, the method comprising the steps of:
   (a) driving a first isolator with a first pulse width modulated signal to produce a first isolated feedback signal;
   (b) filtering the first isolated feedback signal;
   (c) driving a second isolator with a second pulse width modulated signal to produce a second isolated feedback signal; and
   (d) filtering the second isolated feedback signal, wherein the first isolator and the second isolator are both small signal transformers.

8. A method of providing isolated feedback within a Class-D amplifier, wherein the Class-D amplifier is incorporated into an loudspeaker, the method comprising the steps of:

(a) driving a first optoisolator with a first pulse width modulated signal to produce a first isolated feedback signal;
(b) filtering the first isolated feedback signal using a first low pass filter;
(c) driving a second optoisolator with a second pulse width modulated signal to produce a second isolated feedback signal; and
(d) filtering the second isolated feedback signal using a second low pass filter.

9. The method as set forth is claim 8, further including the step of (e) combining the first isolated feedback signal and the second isolated feedback signal to result in a single-ended feedback signal.

10. A method of providing isolated feedback within a Class-D amplifier, wherein the Class-D amplifier is incorporated into a loudspeaker, the method comprising the steps of:
(a) driving a first optoisolator with a first pulse width modulated signal to produce a first isolated feedback signal;
(b) filtering the first isolated feedback signal using a first low pass filter;
(c) driving a second optoisolator with a second pulse width modulated signal to produce a second isolated feedback signal;
(d) filtering the second isolated feedback signal using a second low pass filter; and
(e) combining the first isolated feedback signal and the second isolated feedback signal to result in a single-ended feedback signal.

* * * * *